United States Patent
Chen et al.

(10) Patent No.: US 12,200,899 B2
(45) Date of Patent: Jan. 14, 2025

(54) ELECTRONIC DEVICE

(71) Applicant: InnoLux Corporation, Miao-Li County (TW)

(72) Inventors: Yung-Kan Chen, Miao-Li County (TW); Ching-Ming Chen, Miao-Li County (TW); Chi-Chau Lin, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 198 days.

(21) Appl. No.: 18/154,382

(22) Filed: Jan. 13, 2023

(65) Prior Publication Data

US 2023/0276598 A1 Aug. 31, 2023

(30) Foreign Application Priority Data

Feb. 25, 2022 (CN) .......................... 202210181214.8

(51) Int. Cl.
*H05K 7/20* (2006.01)
(52) U.S. Cl.
CPC .......... *H05K 7/202* (2013.01); *H05K 7/20154* (2013.01); *H05K 7/20436* (2013.01); *H05K 7/20963* (2013.01); *H05K 7/20972* (2013.01)
(58) Field of Classification Search
CPC ......... G02F 1/133385; G02F 1/133382; G02F 1/133308; G02F 1/133314; G02F 1/133317; G02F 1/133608; G02F 2201/36; H05K 7/20154; H05K 7/20972; H05K 7/20436; H05K 7/20963; H05K 7/20145; H05K 7/202; H05K 1/0203; H05K 1/0209; H05K 1/142; H05K 2201/056; H05K 7/20609; H05K 7/20736; H05K 7/20136; F21V 29/67; F21V 29/673; F21V 3/00; F28D 1/0233; F28D 9/00

See application file for complete search history.

(56) References Cited

U.S. PATENT DOCUMENTS

2011/0261523 A1    10/2011   Dunn et al.
2012/0026432 A1*    2/2012   Dunn ................ G02F 1/133385
                                                                361/695

(Continued)

FOREIGN PATENT DOCUMENTS

CN        104066298 A     9/2014
JP       2018-206906 A   12/2018

OTHER PUBLICATIONS

Chinese language office action dated May 4, 2023, issued in application No. TW 111139360.

*Primary Examiner* — Michael A Matey
(74) *Attorney, Agent, or Firm* — McClure, Qualey & Rodack, LLP (57) ABSTRACT

An electronic device is provided. The electronic device includes a protective cover, an electronic module, and a heat exchanger. The protective cover has an opening. The electronic module is disposed below the protective cover. The heat exchanger is disposed between the protective cover and the electronic module. A sub-space is defined between the heat exchanger and the protective cover. The heat exchanger has a first flow path and a second flow path. The first flow path and the sub-space communicate. The second flow path and the opening communicate. The first flow path is isolated from the second flow path.

18 Claims, 8 Drawing Sheets

(56) References Cited

U.S. PATENT DOCUMENTS

| | | | |
|---|---|---|---|
| 2012/0096732 A1* | 4/2012 | TeGrotenhuis | F28D 9/0081 |
| | | | 165/166 |
| 2015/0237761 A1* | 8/2015 | Dunn | H05K 7/20972 |
| | | | 362/97.3 |
| 2019/0200488 A1* | 6/2019 | Pal | H05K 7/20836 |
| 2021/0254904 A1* | 8/2021 | Bhaskar | F28F 7/02 |
| 2022/0201901 A1* | 6/2022 | Gupta | H05K 7/20836 |
| 2022/0260316 A1* | 8/2022 | Becker | F28F 7/02 |

* cited by examiner

ELECTRONIC DEVICE

CROSS REFERENCE TO RELATED APPLICATIONS

This application claims the benefit of China Patent Application No. 202210181214.8, filed Feb. 25, 2022, the entirety of which is incorporated by reference herein.

BACKGROUND OF THE INVENTION

Field of the Invention

The present disclosure relates to an electronic device. In particular, the present disclosure relates to an electronic device including a heat exchanger.

Description of the Related Art

Currently, many electronic devices rely on electric energy to operate. Some parts or elements of electronic devices need high power input. They may generate heat, and may become overheated. Therefore, a heat exchanger may be used in an electronic device for heat dissipation. In addition, it is desirable to reduce the possibility that moisture and dust will enter the electronic device during heat dissipation.

BRIEF SUMMARY OF THE INVENTION

According to some embodiments, an electronic device is provided. The electronic device includes a protective cover, an electronic module, and a heat exchanger. The protective cover has an opening. The electronic module is disposed below the protective cover. The heat exchanger is disposed between the protective cover and the electronic module. A sub-space is defined between the heat exchanger and the protective cover. The heat exchanger has a first flow path and a second flow path. The first flow path and the sub-space communicate. The second flow path and the opening communicate. The first flow path is isolated from the second flow path.

BRIEF DESCRIPTION OF THE DRAWINGS

The present disclosure can be more fully understood by reading the subsequent detailed description and examples with references made to the accompanying drawings. It should be noted that, various features may be not drawn to scale. In fact, the dimensions of the various features may be arbitrarily increased or decreased for clarity of discussion, and the various features may be drawn schematically.

DETAILED DESCRIPTION OF THE INVENTION

The following description provides many different embodiments, or examples, for implementing different features of the present disclosure. Ordinal terms such as "first", "second", etc., used in the description and claims do not by themselves connote any priority, precedence, or order of one element over another, but are used merely as labels to distinguish one element from another element having the same name. Therefore, a first element in the description may be referred to as a second element in claims. In addition, in different examples of this disclosure, similar and/or corresponding symbols or alphabets may be used repeatedly. These similar and/or corresponding symbols or alphabets are used for the sake of clear description of some embodiments of the present application, and they do not dictate any relationship between different embodiments and/or structures.

The present disclosure may be understood from the following description in accompany with the drawings. In should be noted that, for simplification, in the drawings, it's possible that only part of the electronic device is illustrated. In addition, the number and the dimensions of the elements merely serve as examples, and they are not intended to limit the scope of the present disclosure. It should be noted that, the elements and devices may exist in various forms. In this specification, relative expressions may be used. For example, "above" and "below" may be used to describe the position of one element relative to another. It should be noted that, if a device of the drawings is flipped upside down, an element that is "above" will become an element that is "below".

In this specification, the words "including", "comprising", "having", and the like are open words, so they should be interpreted as meaning "including but not limited to . . . ". Therefore, when the words "including", "comprising", "having", and the like are used in the description of this disclosure, the presence of corresponding features, regions, steps, operations and/or components is specified, and without excluding the presence of one or more other features, regions, steps, operations and/or components. In addition, deviation between any two numerical values or directions may exist. For example, if the first direction is described as perpendicular to the second direction, the angle between the first direction and the second direction may be between 80 degrees to 100 degrees. If the first direction is described as parallel with the second direction, the angle between the first direction and the second direction may be between 0 degrees to 10 degrees.

Unless defined otherwise, all terms (including technical and scientific terms) used herein have the same meaning as commonly understood by those skilled in the art. It should be appreciated that, the terms, which are defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

Figure 1:
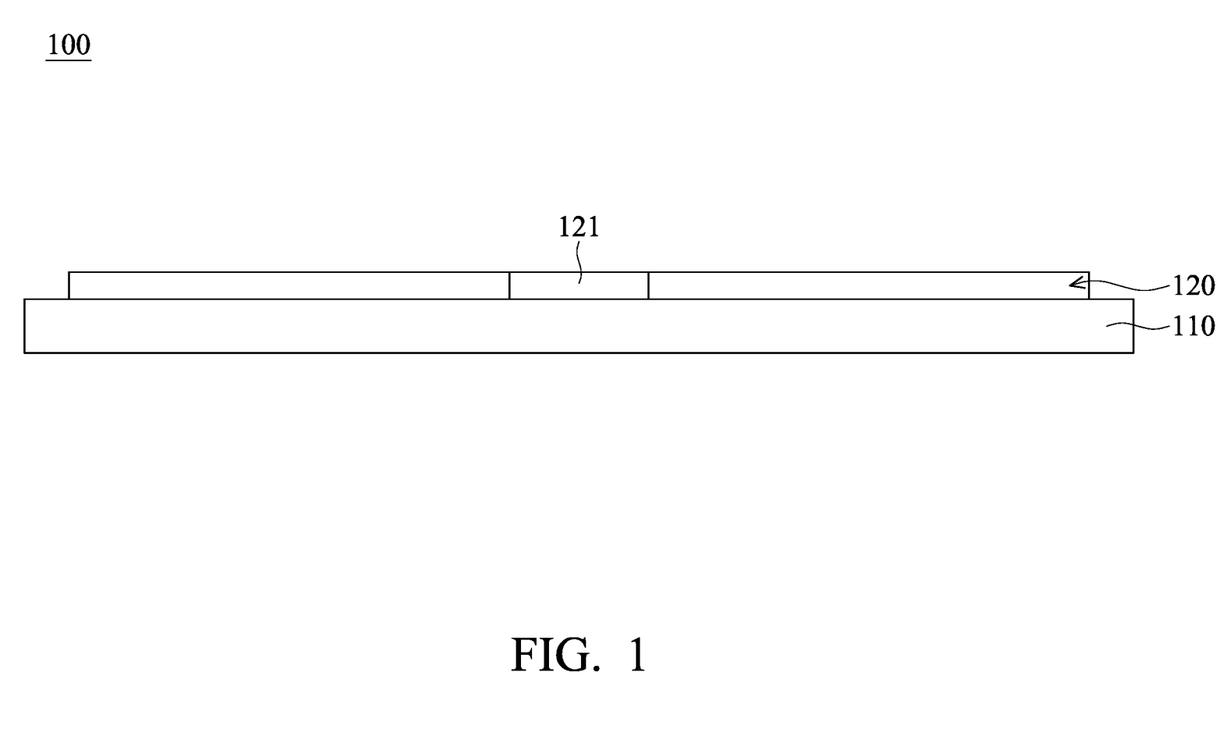
FIG. 1 is a side view of an electronic device, in accordance with some embodiments.
Figure 2:
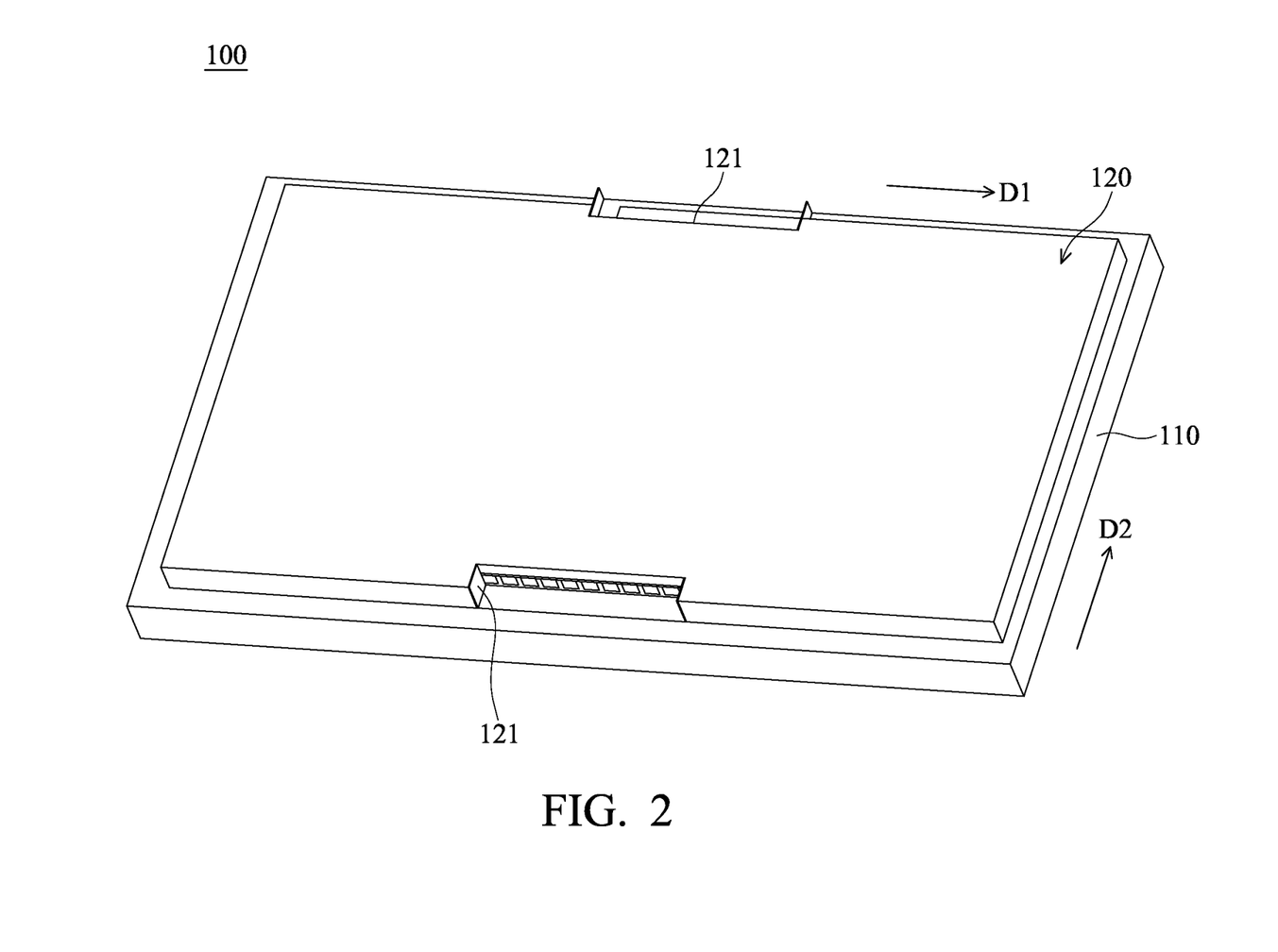
FIG. 2 is a perspective view of the electronic device illustrated in FIG. 1.

Please refer to FIG. 1 and FIG. 2. FIG. 1 is a side view of an electronic device 100, in accordance with some embodiments. FIG. 2 is a perspective view of the electronic device 100 illustrated in FIG. 1. From the top view, the electronic device 100 is quadrilateral, but it is not limited thereto. For ease of illustration, the direction in which the long side of the electronic device 100 extends is defined as a first direction D1, and the direction in which the short side of the electronic device 100 extends is defined as a second direction D2. The first direction D1 is different from the second direction D2. For example, in some embodiments, the first direction D1 is substantially perpendicular to the second direction D2, but the positional relationship between the first direction D1 and the second direction D2 is not limited thereto.

The electronic device 100 includes a casing 110 and a protective cover 120. The casing 110 and the protective cover 120 may include a metal material, such as iron, steel, aluminum, copper, and the like, but the material is not limited thereto. The protective cover 120 is disposed above the casing 110. The protective cover 120 may be connected to the casing 110. The protective cover 120 has at least one opening 121. In this embodiment, the protective cover 120 has two openings 121 arranged in the second direction D2, but the number and the arrangement of the openings 121 are not limited thereto. In some embodiments, there may be only one opening 121. The opening 121 may be used as an exit where heat dissipates, so that heat inside the electronic device 100 exits the electronic device 100 via the opening 121.

Figure 3:
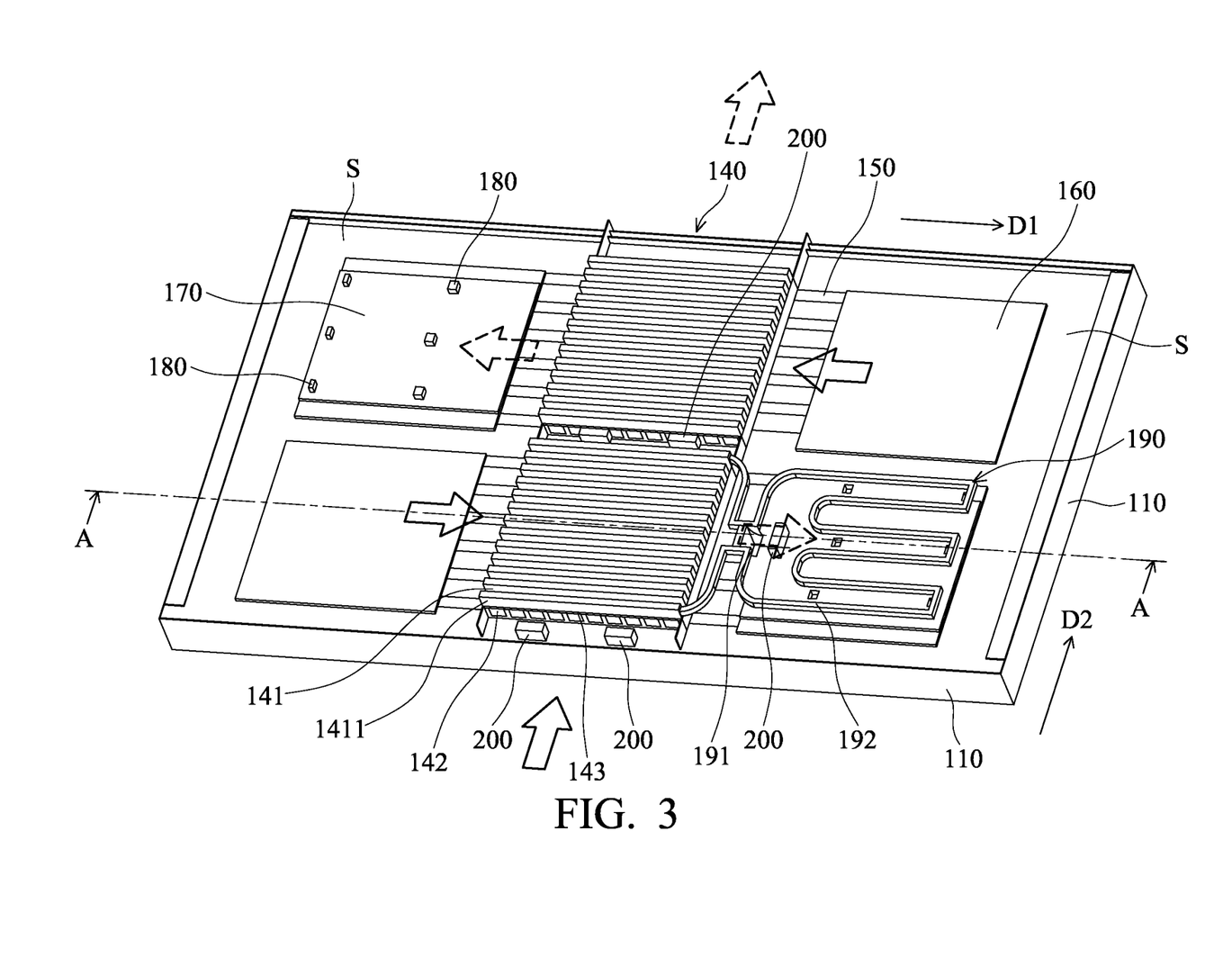
FIG. 3 is a perspective view of the electronic device illustrated in FIG. 1, with the protective cover omitted.
Figure 4:
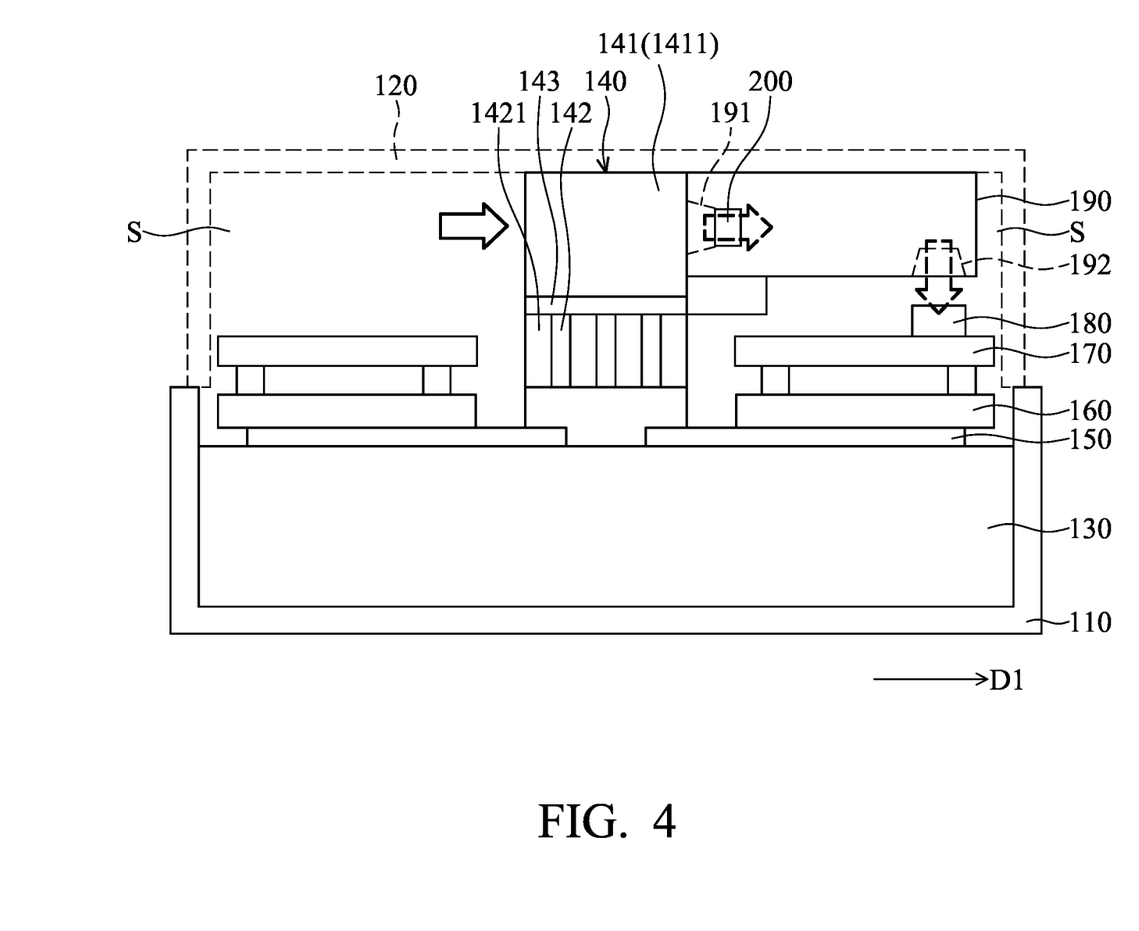
FIG. 4 is a cross-sectional view taken along line A-A in FIG. 3.
Figure 5:
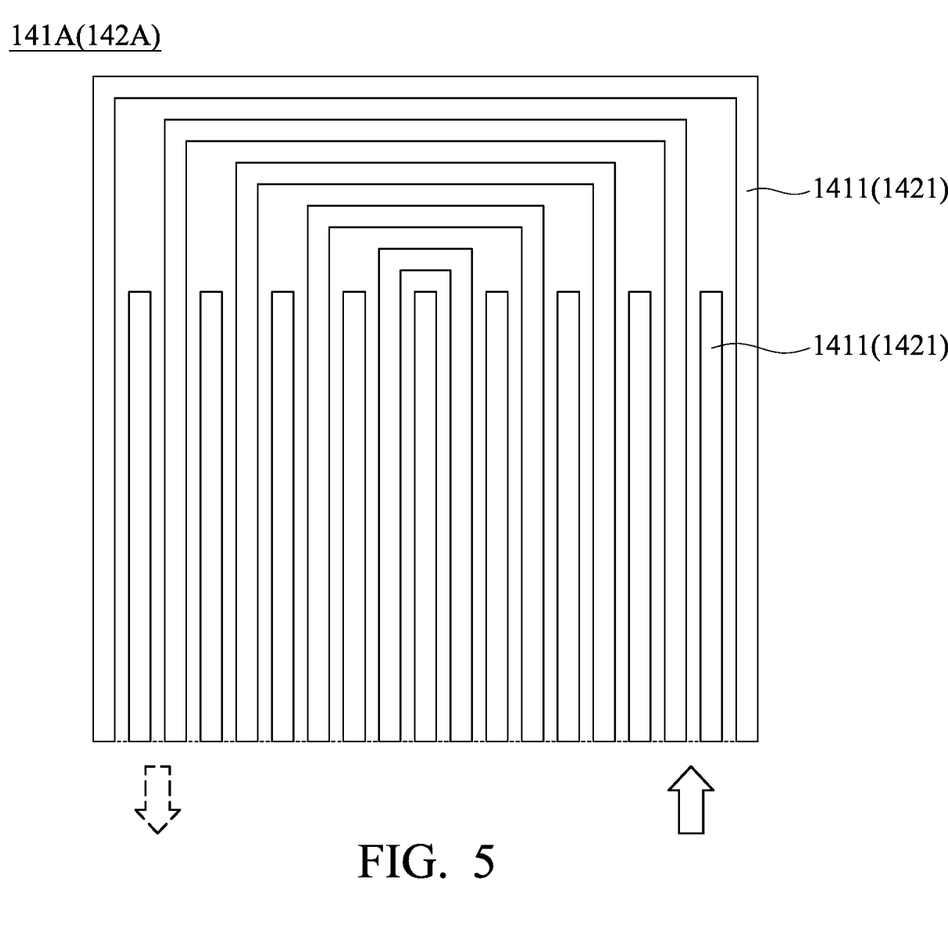
FIG. 5 to FIG. 8 illustrate flow paths with different shapes.
Figure 6:
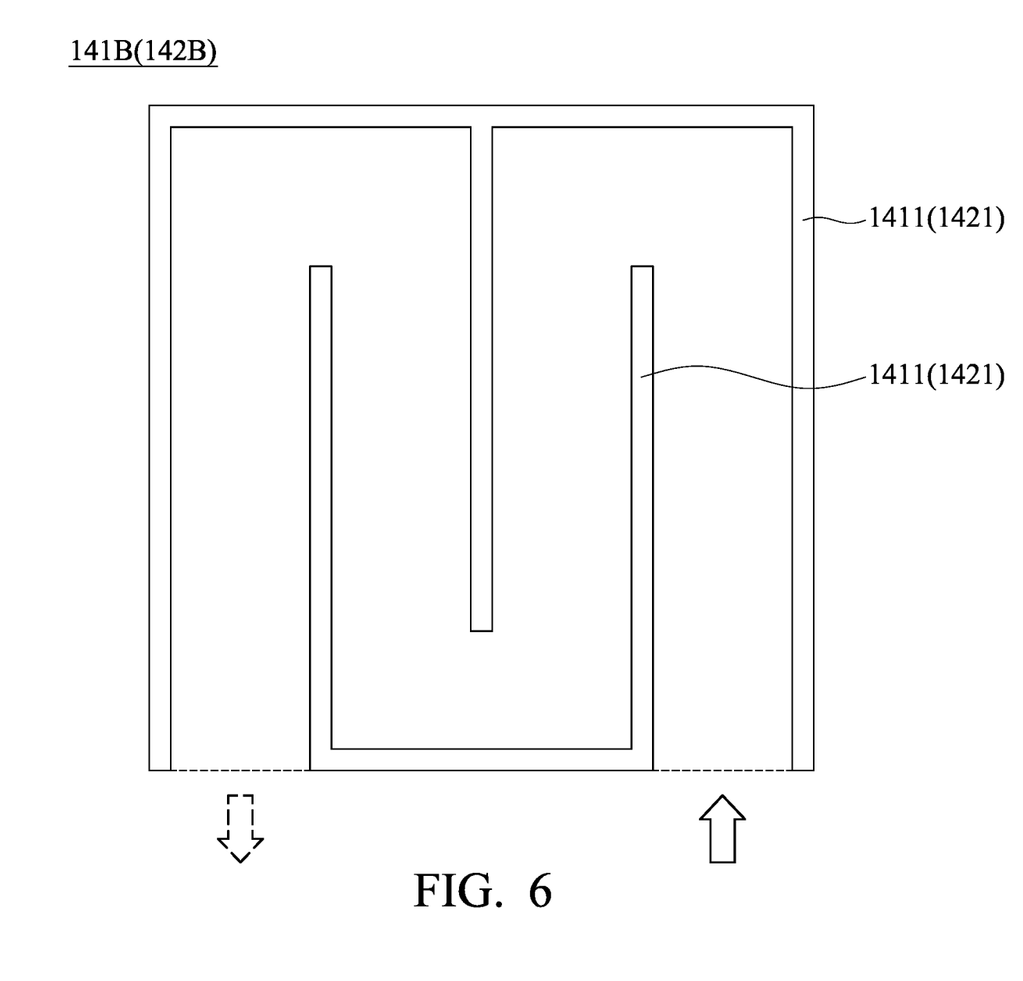
Figure 7:
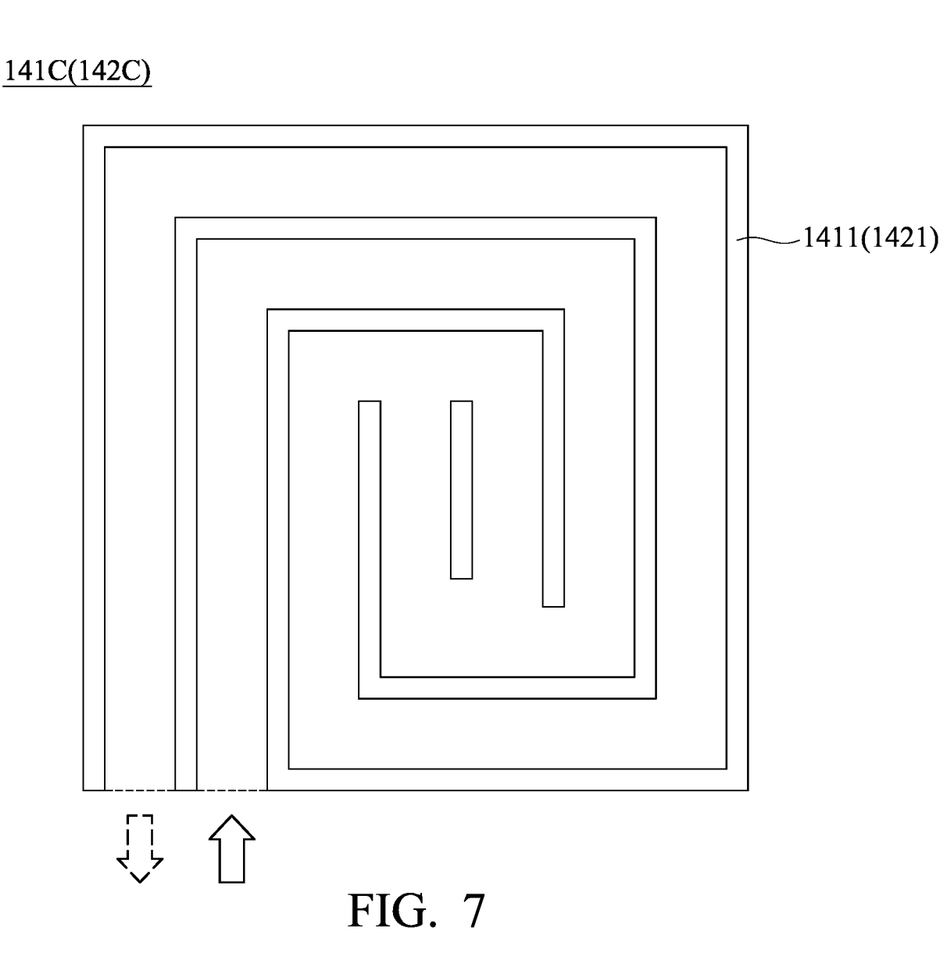
Figure 8:
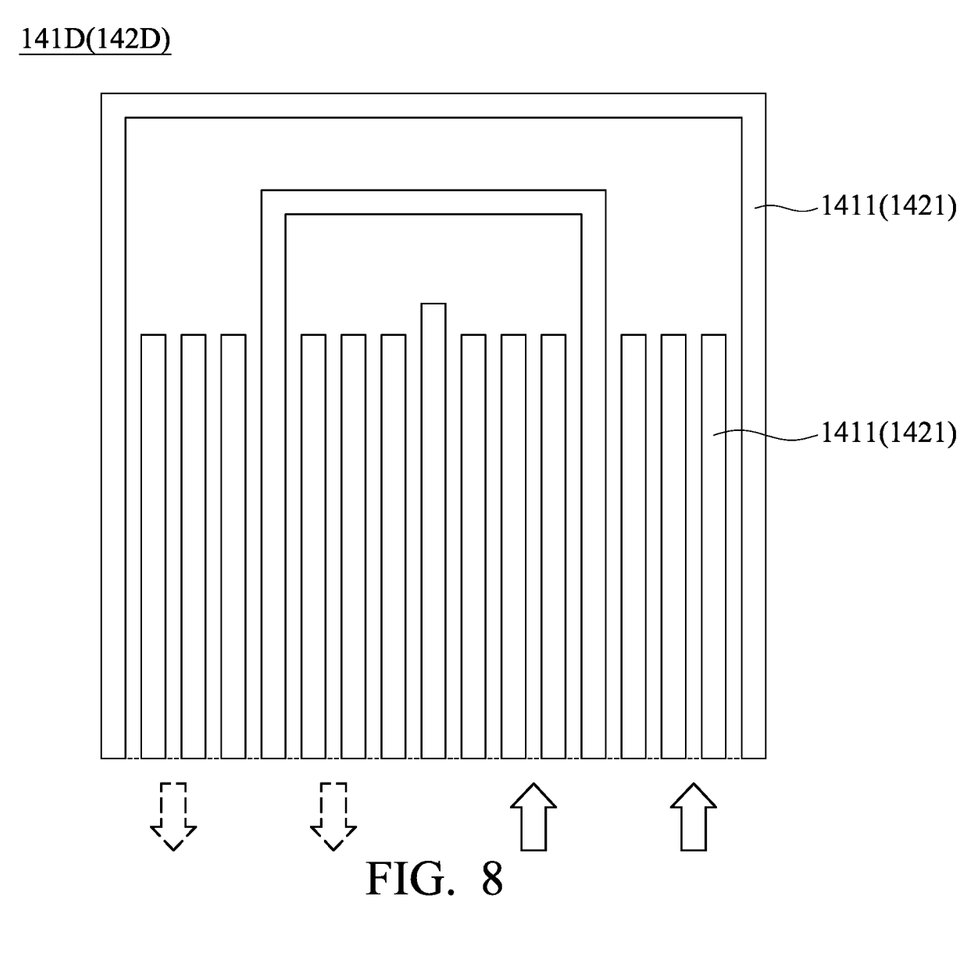

Next, please refer to FIG. 3 and FIG. 4 to further understand the electronic device 100. FIG. 3 is a perspective view of the electronic device 100 illustrated in FIG. 1, with the protective cover 120 omitted. FIG. 4 is a cross-sectional view taken along line A-A in FIG. 3. It should be noted that, for ease of illustration, the protective cover 120 is not illustrated in FIG. 3, but the position of the protective cover 120 is illustrated in dotted lines in FIG. 4. The electronic device 100 further includes an electronic module 130, a heat exchanger 140, at least one first heat transfer element 150, at least one second heat transfer element 160, at least one circuit assembly 170, and at least one electronic element 180. In detail, the electronic module 130, the heat exchanger 140, the first heat transfer element 150, the second heat transfer element 160, and the circuit assembly 170 may be disposed inside the internal space between the protective cover 120 and the casing 110, so that these elements are protected by the protective cover 120 and the casing 110. For ease of illustration, some elements may be omitted.

The electronic module 130 is disposed below the protective cover 120. In detail, the electronic module 130 is disposed between the heat exchanger 140 and the casing 110. Since the electronic module 130 may be different types of modules or combinations of modules, the electronic module 130 is schematically illustrated in FIG. 4. The electronic module 130 may include a display module, an antenna module, a sensing module, or a tiled module, but it is not limited thereto. The electronic module 130 may include a bendable, a curved or flexible electronic module. The display module may not be a self-emissive display module, or the display module may be a self-emitting display module, but it is not limited thereto. The antenna module may be a liquid crystal type antenna module or a non liquid crystal type antenna module, but it is not limited thereto. The sensing module may be a sensing module that is capable of sensing capacitance, light, thermal energy, or ultrasonic sounds, but it is not limited thereto. The tiled module may be a display tiled module or antenna tiled module, but it is not limited thereto. In the following description, a display module is taken as an example of the electronic module 130, but it is not limited thereto. Also, the electronic module 130 may include a display unit and a backlight unit.

The display unit may include two substrates and one or more layers disposed therebetween, such as a display layer, a driving circuit layer, and the like. The substrates may include a flexible substrate or a hard substrate. For example, the material of the substrates may include glass, quartz, polymers, metals, and the like. The polymers may include polycarbonate (PC), polyimide (PI), polyethylene terephthalate (PET), other suitable materials, and combinations thereof, but it is not limited thereto. The display layer may include liquid crystal (LC) and/or light-emitting element such as a light-emitting diode (LED). For example, the type of liquid crystal may include twisted nematic (TN) liquid crystal, supertwisted nematic (STN) liquid crystal, vertical alignment (VA) liquid crystal, in-plane switching (IPS) liquid crystal, cholesteric liquid crystal, fringe field switching (FFS) liquid crystal, another suitable liquid crystal, or a combination thereof, but it is not limited thereto. The driving circuit layer may include a transistor, a data line, a scan line, a dielectric layer, or another line or layer, but it is not limited thereto.

The backlight unit may include one or more light-emitting elements to provide light to the display unit. The light-emitting element may include a light-emitting diode, such as mini LED, micro LED, organic light-emitting diode (OLED), or another suitable light-emitting element, but it is not limited thereto. In some embodiment, the light-emitting element may include a light transformation material. The light transformation material may include quantum dot (QD), fluorescence, phosphor, or another suitable material, but it is not limited thereto. The light-emitting element may have high brightness and high power consumption, but it is not limited thereto.

The heat exchanger 140 is disposed between the protective cover 120 and the electronic module 130. The heat exchanger 140 and the opening 121 of the protective cover 120 communicate. In some embodiments, the width of the area where the heat exchanger 140 is disposed is close to or substantially the same as the width of the opening 121. In some embodiments, the heat exchanger 140 may be connected to the upper surface of the electronic module 130 via thermal conductive paste, thermal conductive tape, or methods such as taping, welding, screw fastening, and the like, but the connection method is not limited thereto.

A sub-space S is defined between the heat exchanger 140 and the protective cover 120. The sub-space S and the opening 121 of the protective cover 120 do not communicate. In this embodiment, two sub-spaces S arranged in the first direction D1 are between the heat exchanger 140 and the protective cover 120, but the number and the arrangement of the sub-spaces S are not limited thereto. For example, in some other embodiments, the opening 121 and the heat exchanger 140 may be disposed at the edge area of the electronic device 100, so that one single sub-space S is defined between the heat exchanger 140 and the protective cover 120.

The heat exchanger 140 may be a plate fin heat exchanger, but it is not limited thereto. As shown in FIG. 3 and FIG. 4, the heat exchanger 140 includes at least one first flow path 141, at least one second flow path 142, at least one base 143, a plurality of first heat dissipation fins 1411, and a plurality of second heat dissipation fins 1421. The first heat dissipation fins 1411 are disposed above the base 143, and the second heat dissipation fins 1421 are disposed below the base 143. The first heat dissipation fins 1411 and the second heat dissipation fins 1421 are connected to the base 143, respectively. The first flow path 141 is formed between the protective cover 120, the base 143, and at least two of the first heat dissipation fins 1411. In addition, the second flow path 142 is formed between the base 143, the upper surface of the electronic module 130, and at least two of the second heat dissipation fins 1421. In other words, the first flow path 141 is disposed above the second flow path 142, and the first flow path 141 is isolated from the second flow path 142 by the base 142, but the arrangement of the first flow path 141 and the second flow path 142 is not limited thereto. For example, in some embodiments, the first flow path 141 may be disposed below the second flow path 142. The first flow path 141 may be isolated from the second flow path 142 by other methods.

The first flow path 141 extends in the first direction D1. The first flow path 141 and the sub-spaces S communicate. For example, the two sub-spaces S communicate via the first flow path 141. The second flow path 142 extends in the second direction D2. The first direction D1 may be different from the second direction D2. The second flow path 142 and the opening 121 communicate. It should be noted that, in this embodiment, the two first heat dissipation fins 1411 that are closest to the two openings 121 may be connected to the protective cover 120 to serve as the barrier between the first flow path 141 and the outside of the electronic device 100, so that the first flow path 141 is isolated from the outside of the electronic device 100, and the first flow path 141 is provided so that the two sub-spaces S communicate. In addition, the two second heat dissipation fins 1421 that are closest to the two sub-spaces S (for example, the leftmost and the rightmost of the second heat dissipation fins 1421 in FIG. 4) may serve as the barrier between the second flow path 142 and the two sub-spaces S, so that the second flow path 142 is isolated from the two sub-spaces S.

Furthermore, in this embodiment, the heat exchanger 140 is a single plate fin heat exchanger, the first heat dissipation fins 1411 are disposed on the upper surface of the base 143, and the second heat dissipation fins 1421 are disposed on the lower surface of the base 143. However, in some embodiments, the heat exchanger 140 may include two staggered plate fin heat exchangers, with each of the them having heat dissipation fins on only one surface of the base.

The fluid in the first flow path 141 and the fluid in the second flow path 142 may be air, but they are not limited thereto. As described above, the fluid in the first flow path 141 flows inside the electronic device 100 and substantially does not flow out of the electronic device 100. The fluid in the second flow path 142 may flows into the electronic device 100 from the outside or flows out of the electronic device 100. In detail, heat exchange may be accomplished by the first flow path 141 (internal heat exchange) and the second flow path 142 (external heat exchange). In addition, the fluid in the first flow path 141 is substantially isolated from the second flow path 142, the fluid in the second flow path 142 is substantially isolated from the first flow path 141, so heat exchange efficiency is enhanced. For ease of illustration, in the drawings, the arrows in solid lines represents hotter fluid, and the arrows in dotted lines represents cooler fluid. Therefore, the flow direction of the fluid is clearly illustrated.

In addition, the sub-spaces S of the electronic device 100 are substantially isolated from the outside of the electronic device 100 during internal heat exchange due to the arrangement of the first flow path 141 and the second flow path 142, thereby reducing the possibility that moisture and dust can enter the sub-spaces S. Since the entirety of the protective cover 120 except for the opening 121 (i.e., the part that encloses the sub-spaces S) may be connected to the casing 110 or the electronic module 130 in a relatively firm way, and since the heat exchanger 140 is configured to isolate the sub-spaces S, the first flow path 141 and the two sub-spaces S collectively form a space that is isolated from the outside of the electronic device 100, further reducing the possibility of moisture and dust entering the sub-spaces S.

The first heat transfer element 150 is disposed in at least one of the sub-spaces S. In detail, the first heat transfer element 150 may be disposed between the second heat transfer element 160 and the electronic module 130. In some embodiments, the first heat transfer element 150 may transfer heat between the heat exchanger 140 and the electronic module 130 by at least partially in contact with the heat exchanger 140 or other methods. For example, in some embodiments, one end of the first heat transfer element 150 is in contact with the heat exchanger 140, and in some embodiments, there is a heat transfer medium between one end of the first heat transfer element 150 and the heat exchanger 140. The first heat transfer element 150 may be a heat pipe, but it is not limited thereto. In some embodiments, the first heat transfer element 150 may be connected to the upper surface of the electronic module 130 via thermal conductive paste, thermal conductive tape, or methods such as taping, welding, screw fastening, and the like, but the connection method is not limited thereto.

The second heat transfer element 160 is disposed in at least one of the sub-spaces S. The second heat transfer element 160 may be disposed between the circuit assembly 170 and the first heat transfer element 150. In some embodiments, the second heat transfer element 160 may transfer heat to the heat exchanger 140. For example, in FIG. 4, heat may be transferred between one end of the second heat transfer element 160 and the heat exchanger 140 via the first heat transfer element 150. In some embodiments, the second heat transfer element 160 may be at least partially in contact with the heat exchanger 140. In some embodiments, the second heat transfer element 160 may include metals or other materials with high conductivity. In some embodiments, the second heat transfer element 160 may be connected to the upper surface of the first heat transfer element 150 via thermal conductive paste, thermal conductive tape, or methods such as taping, welding, screw fastening, and the like, but the connection method is not limited thereto.

The circuit assembly 170 is disposed in at least one of the sub-spaces S. In detail, the circuit assembly 170 may be disposed above the second conductive element 160. The circuit assembly 170 may be a printed circuit board (PCB), a flexible printed circuit (FPC), a rigid-flex board, and the like. There may be electronic element 180 disposed on the circuit assembly 170. The electronic element 180 may include a passive element and an active element, such as a capacitor, a resistor, an inductance, a diode, a transistor, but it is not limited thereto.

When the electronic device 100 is in operation, the interior of the electronic device 100 may generate heat (including but not limited to the electronic module 130 and/or the electronic element 180), and the heat generated by the electronic device 100 may be dissipated by the heat exchanger 140, the first heat transfer element 150, the second heat transfer element 160, and the circuit assembly 170. For example, in some embodiments, the heat generated by the electronic module 130 may be transferred to the heat exchanger 140 by the first heat transfer element 150 and/or the second heat transfer element 160, so that heat in the sub-spaces S is absorbed and moved out.

Please still refer to FIG. 3 and FIG. 4. In some embodiments, to enhance heat dissipation efficiency, the electronic device 100 may further include a collecting element 190. The collecting element 190 is disposed in at least one of the sub-spaces S. In detail, the collecting element 190 may be disposed between the protective cover 120 and the circuit assembly 170. In some embodiments, the collecting element 190 may be claw-shaped, but it is not limited thereto. In some embodiments, the collecting element 190 may be formed by insert molding, but it is not limited thereto. For ease of illustration, only one collecting element 190 is illustrated in FIG. 3, but the number of collecting element 190 is not limited thereto. For example, for each circuit assembly 170, there may be one collecting element 190 disposed thereon.

The collecting element 190 includes an inlet 191 and an outlet 192. The inlet 191 and the first flow path 141 communicate. In some embodiments, the portion of the collecting element 190 that is close to the inlet 191 may have a curved shape, so that it may be easier for the fluid to flow. The position of the outlet 192 corresponds to the position of the electronic element 180. For example, one outlet 192 of the collecting element 190 may correspond to one or more electronic elements 180. The collecting element 190 may collect the fluid out of the first flow path 141 to the electronic element 180. That is, the collecting element 190 may directly help the element that generates heat dissipate heat. In this embodiment, the collecting element 190 only have one inlet 191 to further collect the fluid from the first flow path 141, but the number of inlet 191 of the collecting element 190 is not limited thereto.

In some embodiments, to enhance heat dissipation efficiency, the electronic device 100 may further include at least one fan 200 that makes it easier for the fluid to flow. The fan 200 may be disposed at the opening 121 and/or in the heat exchanger 140 to facilitate the external heat exchange. The fan 200 may also be disposed corresponding to the inlet 191 to facilitate internal heat exchange. In some embodiments, the fan 200 may be omitted, and other methods are used to make it easier for the fluid to flow. Since the electronic device 100 may be water-proof, dust-proof and/or may dissipate heat effectively, the electronic device 100 may be operated under high-temperature environments, including but not limited to as outdoor devices, automotive devices, and the like.

It should be noted that, other modifications may be made to the electronic device 100. For example, in some embodiments, the heat exchanger 140 may include multi-layered first flow path 141 and/or multi-layered second flow path 142, and thus the area for heat dissipation is increased. In some embodiments, to facilitate the flow of the fluid and/or to increase the area for heat dissipation, the cross-section of the first flow path 141 and/or the cross-section of the second flow path 142 may be triangular, polygonal, circular, etc. In some embodiments, the first flow path 141 and the protective cover 120 may be formed integrally as a single piece and/or the second flow path 141 and the electronic module 130 may be formed integrally as a single piece, and thus the manufacture process is simplified and/or the cost is reduced. In some embodiments, the protective cover 120 may include different materials at the same time. For example, the part of the protective cover 120 that corresponds to the heat exchanger 140 may include material with high conductivity, while the rest of the protective cover 120 may include material with high strength.

In the following description, similar symbols are used to denote identical elements. FIG. 5 to FIG. 8 illustrate flow paths 141A, 141B, 141C, 141D, 142A, 142B, 142C, and 142D with different shapes. The flow paths with different shapes may have different effects, for example, the retention time of the fluid may be increased, design flexibility may be enhanced, heat exchange efficiency may be enhanced, and the like. It should be noted that, in FIG. 5 to FIG. 8, the fluid enters into and exits the same side of the flow path, but the present disclosure is not limited thereto. The exit of the flow path for the fluid to flow out may be adjusted based on actual need, and the fluid may enter into the flow path on one side and leave the flow path on another side. For example, the exit of the flow path for the fluid to flow out may be determined based on the elements that generate heat. Furthermore, different combinations of the flow paths illustrated in FIG. 5 to FIG. 8 may be used arbitrarily.

As described above, some embodiments of the present disclosure provide an electronic device including a heat exchanger. The heat exchanger includes a flow path for internal heat exchange and a flow path for external heat exchange. The flow path for internal heat exchange and the sub-space inside the electronic device communicate. The flow path for external heat exchange and the outside of the electronic device communicate. The fluid in the flow path for internal heat exchange is substantially isolated from the fluid in the flow path for external heat exchange, so heat exchange efficiency may be enhanced. In addition, during internal heat exchange, there is barely any convection between the sub-space of the electronic device and the outside of the electronic device, thereby reducing the possibility that moisture and dust can enter the sub-space. Furthermore, since the protective cover of the electronic device may be connected to the casing in a relatively firm way, the possibility that moisture and dust can enter the sub-space is reduced further.

Besides, the electronic device of the present disclosure may include some electronic elements with high power consumption, including but not limited to a light-emitting element, a capacitor, a resistor, an inductance, a diode, a transistor, etc. Also, a collecting element may be placed at the place in need, directly helping the element that generates heat dissipate heat. In addition, the electronic device may include a heat transfer element and/or a fan, which facilitates heat dissipation. Therefore, heat dissipation of the electronic device is enhanced. As described above, since the electronic device of the present disclosure is water-proof, dust-proof, and/or may dissipate heat effectively, the electronic device of the present disclosure may be operated under high-temperature environments, including but not limited to as outdoor devices, automotive devices, and the like.

The foregoing outlines features of several embodiments, so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and the combination of various claims and embodiments are within the scope of the disclosure.

What is claimed is:

1. An electronic device, comprising:
a protective cover having an opening;
an electronic module disposed below the protective cover;
a heat exchanger disposed between the protective cover and the electronic module, wherein a sub-space is defined between the heat exchanger and the protective cover, and
a collecting element disposed in the sub-space for collecting a fluid from the first flow path to the electronic element, wherein the collecting element has an inlet and an outlet, the inlet and the first flow path communicate, and the outlet corresponds to the electronic element;

wherein the heat exchanger has a first flow path and a second flow path, the first flow path and the sub-space communicate, the second flow path and the opening communicate, and the first flow path is isolated from the second flow path.

2. The electronic device as claimed in claim 1, wherein the first flow path extends in a first direction, the second flow path extends in a second direction, and the first direction is different from the second direction.

3. The electronic device as claimed in claim 2, wherein the first direction is perpendicular to the second direction.

4. The electronic device as claimed in claim 2, wherein the heat exchanger further comprises a base and a plurality of first heat dissipation fins close to the base, and the first flow path is formed between the protective cover, the base, and at least two of the first heat dissipation fins.

5. The electronic device as claimed in claim 4, wherein the heat exchanger further comprises a plurality of second heat dissipation fins close to the base, and the second flow path is formed between the base, the electronic module, and at least two of the second heat dissipation fins.

6. The electronic device as claimed in claim 1, wherein the heat exchanger further comprises a base, and the first flow path and the second flow path are formed on different sides of the base.

7. The electronic device as claimed in claim 1, wherein there is more than one sub-space, and the sub-spaces communicate via the first flow path.

8. The electronic device as claimed in claim 7, wherein the first flow path is isolated from an outside of the electronic device, and the second flow path is isolated from the sub-spaces.

9. The electronic device as claimed in claim 1, wherein a fluid in the first flow path flows inside of the electronic device and does not flow out of the electronic device.

10. The electronic device as claimed in claim 9, wherein the fluid in the first flow path is air.

11. The electronic device as claimed in claim 1, further comprising a circuit assembly and an electronic element disposed in the sub-space, wherein the electronic element is disposed on the circuit assembly.

12. The electronic device as claimed in claim 1, wherein the collecting element is claw-shaped.

13. The electronic device as claimed in claim 1, further comprising a fan disposed to correspond to the inlet.

14. The electronic device as claimed in claim 11, further comprising a first heat transfer element disposed in the sub-space, wherein the first heat transfer element is disposed between the circuit assembly and the electronic module.

15. The electronic device as claimed in claim 14, wherein the first heat transfer element is at least partially in contact with the heat exchanger.

16. The electronic device as claimed in claim 14, further comprising a second heat transfer element disposed in the sub-space, wherein the second heat transfer element is disposed between the circuit assembly and the first heat transfer element.

17. The electronic device as claimed in claim 16, wherein the first heat transfer element is a heat pipe, and the second heat transfer element is connected to an upper surface of the heat pipe.

18. The electronic device as claimed in claim 1, wherein the electronic module comprises a light-emitting element.

* * * * *